(12) United States Patent
Higashi

(10) Patent No.: US 9,668,394 B2
(45) Date of Patent: May 30, 2017

(54) COMPONENT MOUNTING METHOD AND COMPONENT MOUNTING SYSTEM

(71) Applicant: PANASONIC INTELLECTUAL PROPERTY MANAGEMENT CO., LTD., Osaka (JP)

(72) Inventor: Masayuki Higashi, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 235 days.

(21) Appl. No.: 14/632,279

(22) Filed: Feb. 26, 2015

(65) Prior Publication Data

US 2015/0245493 A1  Aug. 27, 2015

(30) Foreign Application Priority Data

Feb. 26, 2014  (JP) .................................. 2014-034998

(51) Int. Cl.
*H05K 3/30* (2006.01)
*H05K 13/08* (2006.01)
*H05K 3/34* (2006.01)

(52) U.S. Cl.
CPC .............. *H05K 13/08* (2013.01); *H05K 3/34* (2013.01); *H05K 2201/09972* (2013.01); *H05K 2203/1476* (2013.01); *Y10T 29/49137* (2015.01); *Y10T 29/53174* (2015.01)

(58) Field of Classification Search
CPC ........... Y10T 29/4913; Y10T 29/53178; Y10T 29/49126; Y10T 29/49137; Y10T 29/49826; Y10T 29/53261

USPC ......... 29/836, 739, 740, 741, 743, 832, 834, 29/DIG. 44
See application file for complete search history.

(56) References Cited

U.S. PATENT DOCUMENTS 5,926,950 A * 7/1999 Asai .................... H05K 13/0413
29/740
8,196,295 B2 * 6/2012 Imafuku ............ H05K 13/0413
29/709

FOREIGN PATENT DOCUMENTS

JP          3378134 B2    12/2002

* cited by examiner

*Primary Examiner* — Thiem Phan
(74) *Attorney, Agent, or Firm* — Pearne & Gordon, LLP

(57) ABSTRACT

A component mounting system makes a mounting head to which a component holder is attached perform component mounting operation including upward and downward movement operation with respect to a board and mounts a component on the board. A mounting apparatus repeats reciprocating mounting operations in which the component holder is moved in a mounting order relative to a reference line extending in a first direction being the board conveyance direction such that that the component holder is advanced over the board in a second direction orthogonal to the first direction and then a held high-height component is mounted and thereafter the component holder is retracted from the board in the second direction. The mounting order is set in order in which a mounting coordinate of the high-height component is larger in the second direction relative to the reference line.

4 Claims, 7 Drawing Sheets

007
COMPONENT MOUNTING METHOD AND COMPONENT MOUNTING SYSTEM

CROSS REFERENCE TO RELATED APPLICATIONS

This application is based upon and claims the benefit of priority of Japanese Patent Application No. 2014-34998 filed on Feb. 26, 2014, the contents of which are incorporated herein by reference in its entirety.

BACKGROUND OF THE INVENTION

1. Field of the Invention

The present invention relates to a component mounting method and a component mounting system for mounting an electronic component on a board and producing a mount board.

2. Description of the Related Art

In a manufacturing process of a mount board in which electronic components are mounted on a board, many kinds of electronic components are mounted on the same board. These electronic components are transferred to mounting points of the board with the electronic components held by a component holder attached to a mounting head and herein, the component holder is downwardly moved with respect to the board to thereby install the electronic components in mounting positions of the board. The size or shape of the electronic component targeted for mounting varies depending on a kind of component, and the kind of component includes the so-called high-height component such as a connector component with a height size larger than that of a normal chip type component. Since such a high-height component may cause interference with an already mounted component already mounted on the board in a height direction in component mounting operation, various measures to prevent interference with the already mounted component using the high-height component as a target are proposed conventionally (see, for example, Japanese Patent No. 3378134).

SUMMARY OF THE INVENTION

However, the measures to prevent interference of the high-height component in the art including the example of Japanese Patent No. 3378134 described above have difficulty in actual application since complicated processing is required. That is, the art requires individual processing every target board, for example, an upward and downward movement stroke of a component holder is changed based on the highest component height of the already mounted components, or a horizontal movement path of the component holder is set so as to avoid a position in which the highest component is mounted. As a result, measures to prevent interference of the high-height component by a simple and versatile method are desired.

Hence, an object of the present invention is to provide a component mounting method and a component mounting system capable of preventing interference of a high-height component in component mounting operation with a simple and versatile method.

According to a first aspect of the present invention, there is provided a component mounting method for making a mounting head to which a component holder is attached perform component mounting operation including upward and downward movement operation with respect to a board conveyed in a board conveyance direction and mounting each component held by the component holder on the board, the component mounting method including: a low-height component mounting step of mounting a low-height component on the board; and a high-height component mounting step of mounting a high-height component on the board on which the low-height component is mounted, wherein the low-height component is a component capable of avoiding interference with a low-height component already mounted on the board by upward and downward movement operation of the component holder, the high-height component is a component which can avoid interference with the low-height component already mounted on the board by upward and downward movement operation of the component holder but cannot avoid interference with a high-height component already mounted on the board by upward and downward movement operation of the component holder, and the high-height component mounting step includes repeating reciprocating mounting operations in which the component holder is moved in a mounting order relative to a reference line extending in a first direction which is the board conveyance direction such that that the component holder is advanced over the board in a second direction orthogonal to the first direction and then a high-height component held by the component holder is mounted and thereafter the component holder is retracted from the board in the second direction, wherein the mounting order is set in order in which a mounting coordinate of the high-height component is larger in the second direction relative to the reference line.

According to a second aspect of the present invention, there is provided a component mounting system for making a mounting head to which a component holder is attached perform component mounting operation including upward and downward movement operation with respect to a board conveyed in a board conveyance direction and mounting each component held by the component holder on the board, the component mounting system including: a mounting apparatus for low-height component which mounts a low-height component on the board, and a mounting apparatus for high-height component which mounts a high-height component on the board on which the low-height component is mounted, wherein the low-height component is a component capable of avoiding interference with a low-height component already mounted on the board by upward and downward movement operation of the component holder, the high-height component is a component which can avoid interference with the low-height component already mounted on the board by upward and downward movement operation of the component holder but cannot avoid interference with a high-height component already mounted on the board by upward and downward movement operation of the component holder, and the mounting apparatus for high-height component repeats reciprocating mounting operations in which the component holder is moved in a mounting order relative to a reference line extending in a first direction which is the board conveyance direction such that that the component holder is advanced over the board in a second direction orthogonal to the first direction and then a held high-height component is mounted and thereafter the component holder is retracted from the board in the second direction, wherein the mounting order is set in order in which a mounting coordinate of the high-height component is larger in the second direction relative to the reference line.

According to the aspects of the present invention, interference of a high-height component in component mounting operation can be prevented with a simple and versatile method.

DETAILED DESCRIPTION OF THE EXEMPLARY EMBODIMENTS

Figure 1:
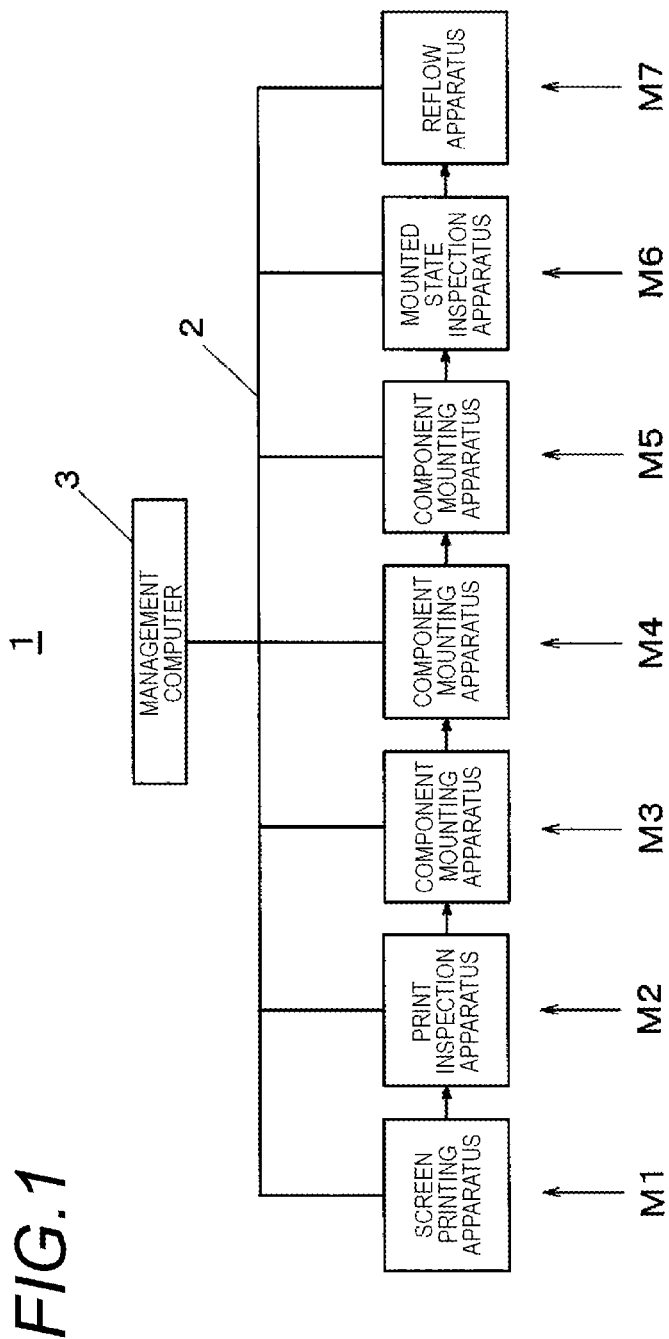
FIG. 1 is a block diagram showing a configuration of a component mounting system according to one embodiment of the present invention.

Next, an embodiment of the present invention is described with reference to the accompanying drawings. First, a configuration of a component mounting system 1 is described with reference to FIG. 1. The component mounting system 1 has a function of mounting an electronic component in a board by soldering and producing a mount board, and is configured to join plural apparatuses for component mounting including a screen printing apparatus M1, a print inspection apparatus M2, component mounting apparatuses M3, M4, M5, a mounted state inspection apparatus M6 and a reflow apparatus M7 and also connect these apparatuses by a communication network 2 and manage all of the apparatuses by a management computer 3.

The screen printing apparatus M1 does screen printing of paste-like solder such as cream solder on an electrode for component bonding formed on a board. The print inspection apparatus M2 makes a decision as to whether a print state of solder printed on the board is good or bad, or a print inspection including detection of a positional deviation of solder printing on the electrode. The component mounting apparatuses M3, M4, M5 sequentially install electronic components in the board on which the solder is printed by the screen printing apparatus M1. The mounted state inspection apparatus M6 inspects mounted states of the electronic components installed by the component mounting apparatuses M3, M4, M5 by an appearance inspection using image recognition. The reflow apparatus M7 heats the board after installing the electronic components according to a predetermined temperature profile to thereby melt the solder and solder the electronic components to the board.

Figure 2:
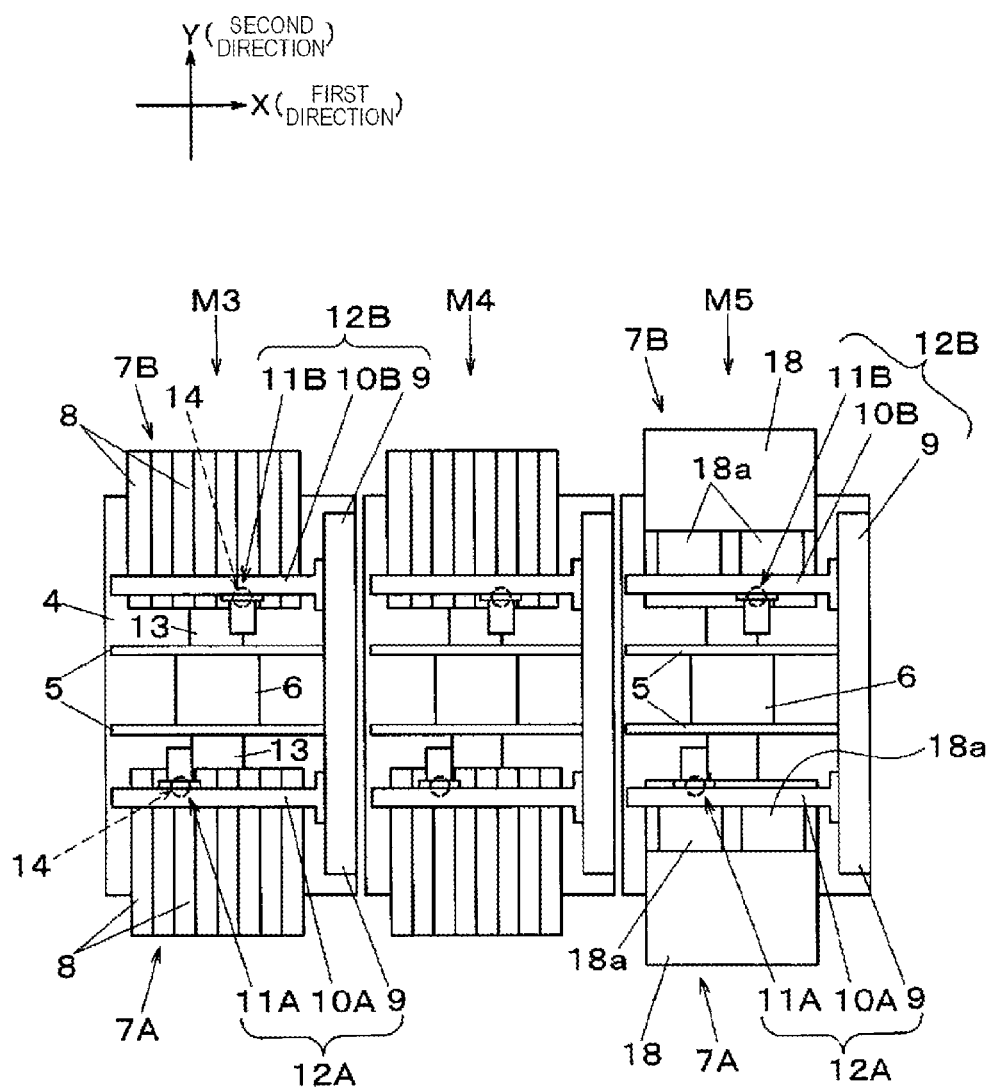
FIG. 2 is a plan view showing a configuration of a component mounting apparatus in the component mounting system according to one embodiment of the present invention.

Configurations of the component mounting apparatuses M3 to M5 having a function of installing the electronic component in the board in the component mounting system 1 configured as described above is described with reference to FIG. 2. Since the component mounting apparatuses M3 and M4 have the same configuration, description of the component mounting apparatus M4 is omitted. In the component mounting apparatus M3, a board conveyance mechanism 5 is arranged on a base 4 in an X direction (first direction) which is a board conveyance direction. The board conveyance mechanism 5 conveys a board 6 targeted for mounting work, and positions and holds the board 6 in a mounting work position by the following component mounting mechanism.

Both sides of the board conveyance mechanism 5 are provided with component supply parts 7A, 7B, and plural tape feeders 8 are juxtaposed to the component supply parts 7A, 7B. The tape feeder 8 performs pitch feeding of a carrier tape for holding relatively small electronic components such as a chip type component to thereby supply these electronic components to a component takeout position by the component mounting mechanism. In one end of the base 4 in the X direction, a Y-axis movement table 9 including a linear driving mechanism is arranged horizontally in a Y direction. Two X-axis movement tables 10A, 10B including linear driving mechanisms similarly are coupled to the Y-axis movement table 9 movably in the Y direction.

Mounting heads 11A, 11B are respectively attached to the X-axis movement tables 10A, 10B, and a suction nozzle 11a (see FIGS. 3 and 4) which is a component holder for sucking and holding the component is attached to the lower end of each of the mounting heads 11A, 11B. The suction nozzle 11a is upwardly and downwardly moved by a nozzle upward and downward movement mechanism built into each of the mounting heads 11A, 11B. The mounting heads 11A, 11B are moved in the X direction and the Y direction by driving the X-axis movement tables 10A, 10B and the Y-axis movement table 9, and accordingly, the mounting heads 11A, 11B respectively take the components out of the tape feeders 8 of the component supply parts 7A, 7B, and transfer and install the components to the board 6 positioned in the board conveyance mechanism 5.

The combination of the Y-axis movement table 9, the X-axis movement table 10A and the mounting head 11A and the combination of the Y-axis movement table 9, the X-axis movement table 10B and the mounting head 11B construct component mounting mechanisms 12A, 12B for transferring and installing the components taken out of the component supply parts 7A, 7B to the board 6, respectively. In this component mounting, the mounting heads 11A, 11B to which the suction nozzles 11a are attached are made to perform component mounting operation including upward and downward movement operation, and the component held by the suction nozzle 11a is mounted on the board 6.

Component recognition cameras 13 are arranged between the component supply parts 7A, 7B and the board conveyance mechanism 5, and when the mounting heads 11A, 11B taking electronic components out of the component supply part 7A, 7B are moved over the component recognition cameras 13, the component recognition cameras 13 image the electronic components with the electronic components held in the mounting heads 11A, 11B. Board recognition cameras 14 moved integrally are positioned in the lower sides of the X-axis movement tables 10A, 10B and are attached to the mounting heads 11A, 11B. The board recognition cameras 14 are moved over the board 6 together with the mounting heads 11A, 11B, and image a recognition mark formed on the board 6. When the electronic components are mounted on the board 6, a position correction at the time of installing the component is made based on results of recognizing imaged results of the board recognition cameras 14 and the component recognition cameras 13 by a recognition processing part (not shown).

Next, a configuration of the component mounting apparatus M5 is described. The component mounting apparatus M5 has a configuration similar to that of the component mounting apparatuses M3, M4 in the board conveyance mechanism 5 and the component mounting mechanisms 12A, 12B, but differs from the component mounting apparatuses M3, M4 in only configurations of the component supply parts 7A, 7B. That is, in the component supply parts 7A, 7B of the component mounting apparatus M5, tray feeders 18 for supplying large-size components are arranged, and the tray feeders 18 supply component trays 18a in which large-size components such as connector components are accommodated in a regular array to the component mounting mechanisms 12A, 12B.

The mounting head 11A (first mounting head) takes a component out of the tray feeder 18 arranged in the component supply part 7A and mounts the component in the board 6 held in the board conveyance mechanism 5, and the mounting head 11B (second mounting head) takes a component out of the tray feeder 18 arranged in the component supply part 7B and mounts the component in the board 6 held in the board conveyance mechanism 5.

In the component mounting system 1 including the component mounting apparatuses M3, M4, M5 configured as described above, the component mounting apparatuses M3, M4 are mounting apparatuses for low-height component using the so-called low-height component such as a chip component with a relatively small size and a small height size as a mounting target, and the component mounting apparatus M5 is a mounting apparatus for high-height component using the so-called high-height component such as a connector component with a large height size as a main mounting target. And, in these component mounting apparatuses M3, M4, M5, component mounting operation is sequentially executed with respect to the board 6 conveyed from the upstream side in the X direction.

That is, the component mounting system 1 including the component mounting apparatuses M3, M4, M5 is constructed so that with respect to the board 6 conveyed in the X direction (first direction) which is the board conveyance direction, the mounting heads 11A, 11B to which the suction nozzles 11a as the component holders are attached are made to perform component mounting operation including upward and downward movement operation and the component held by the suction nozzle 11a is mounted on the board 6. In addition, an example using the mounting head 11A for holding the component by vacuum suction is herein shown as the component holder, but a holding form of the component holder is not limited to the vacuum suction, and the component holder of a mechanical method for holding the component by a gripping member such as a clamp claw may be used.

A component mounting method shown in the embodiment is constructed so that plural kinds of components having fear of causing interference in a height direction when height sizes vary variously and are mixed and mounting operation is executed are broadly divided into two kinds of high-height component and low-height component conveniently. Component mounting sequence is set so as to mount the high-height component after the low-height component is previously mounted, and for the high-height component, a mounting movement path is further preset properly to thereby prevent occurrence of interference with the already mounted component in the height direction.

That is, the low-height component refers to a component capable of avoiding interference with the low-height component already mounted on the board by upward and downward movement operation of the component holder (suction nozzle 11a). Consequently, in the component mounting apparatuses M3, M4 using only the low-height component as the mounting target, the mounting movement path can be freely set without constraints resulting from the interference in the height direction.

On the other hand, the high-height component refers to a component which can avoid interference with the low-height component already mounted on the board by upward and downward movement operation of the component holder but cannot avoid interference with the high-height component already mounted on the board by upward and downward movement operation of the component holder. Consequently, in the component mounting apparatus M5 using the high-height component as the mounting target, proper setting of the mounting movement path is desired in order to avoid the interference in the height direction in component mounting operation.

Figure 3A:
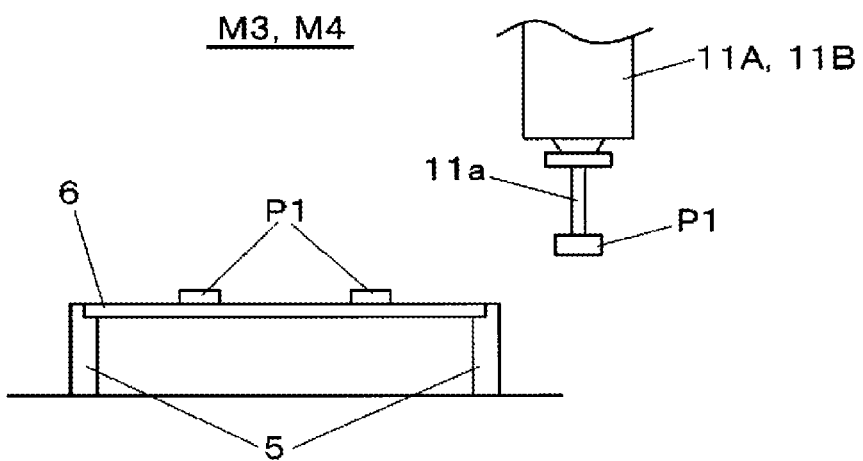
FIGS. 3A and 3B are explanatory diagrams of mounting operation of a low-height component in the component mounting system according to one embodiment of the present invention.

Hereinafter, concrete definitions of the low-height component and the high-height component and a mode of mounting operation using these components as a target is described with reference to FIGS. 3A, 3B, 4A and 4B. First, the low-height component is described with reference to FIGS. 3A and 3B. As shown in FIG. 3A, in the component mounting apparatuses M3, M4, with respect to the board 6 positioned and held in the board conveyance mechanism 5, low-height components P1 are mounted by the mounting heads 11A, 11B. A state in which the low-height components P1 are mounted on the board 6 as an already mounted component is shown herein.

Figure 3B:
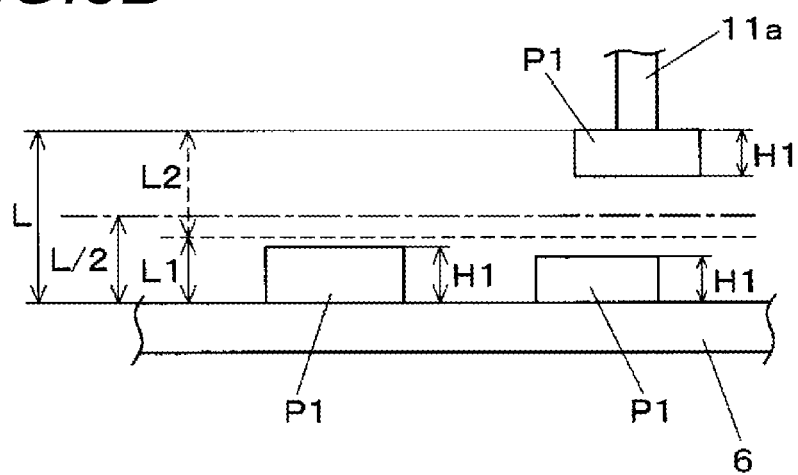

FIG. 3B shows a definition of a height dimension H1 of the low-height component P1. In addition, in FIG. 3B, L shows an upward and downward movement stroke of the component holder (suction nozzle 11a) with respect to an upper surface of the board 6, and L1 and L2 show a first component height and a second component height referred to in definitions of the low-height component and the high-height component. Here, it is set at dimension values in which L1 is smaller than L/2 and L2 is larger than L/2, and is further set so as to satisfy a relation of L1+L2=L.

In the embodiment, a component having the height dimension H1 up to the first component height L1 set as described above among the components mounted on the board 6 is defined as the low-height component P1. Since the height dimension H1 of the low-height component P1 lower than the first component height L1 defined in this manner is smaller than one-half (L/2) the upward and downward movement stroke L, when the moving low-height component P1 held by the mounting head 11A passes over the low-height component P1 already mounted on the board 6, interference between these components does not occur.

That is, in the embodiment, a component capable of avoiding interference with the low-height component P1 already mounted on the board 6 by upward and downward movement operation of the component holder (suction nozzle 11a) is defined as the low-height component P1. By using only such low-height components P1 as the mounting target in the component mounting apparatuses M3, M4, mounting sequence and a mounting movement path can be freely set without considering the interference with the already mounted low-height component P1 in the height direction.

Figure 4A:
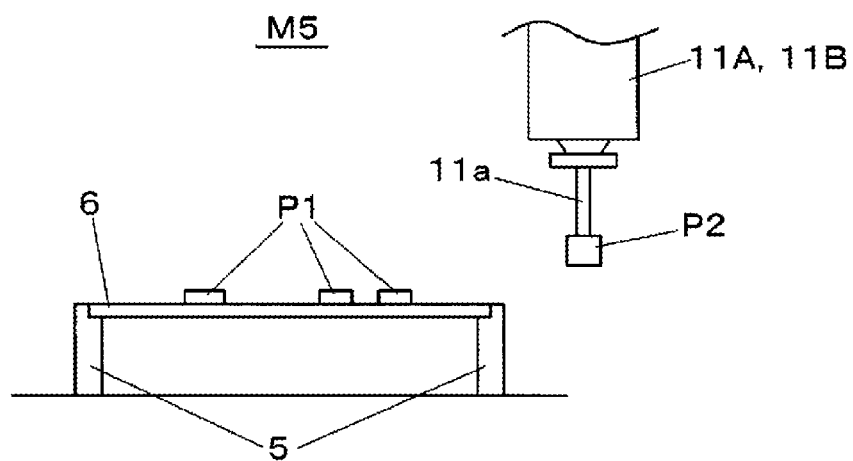
FIGS. 4A and 4B are explanatory diagrams of mounting operation of a high-height component in the component mounting system according to one embodiment of the present invention.

Next, the high-height component is described with reference to FIGS. 4A and 4B. As shown in FIG. 4A, in the component mounting apparatus M5, with respect to the board 6 positioned and held in the board conveyance mechanism 5 with the low-height components P1 already mounted on the component mounting apparatuses M3, M4 in the upstream side, high-height components P2 are mounted by the mounting heads 11A, 11B. In this mounting process, interference between the high-height components in the height direction may occur in a state in which the high-height component P2 defined below is mounted and is present on the board 6 as the already mounted component.

Figure 4B:
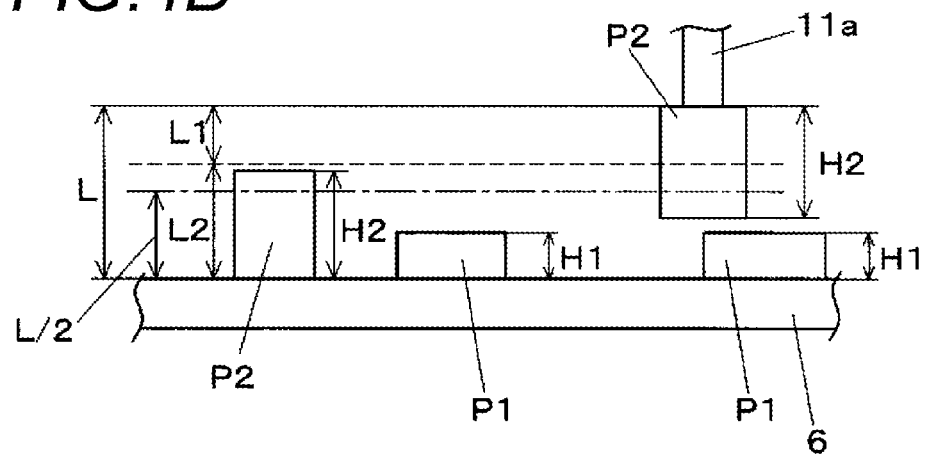

FIG. 4B shows a definition of a height dimension H2 of the high-height component P2. Here, the height dimension H2 of the high-height component P2 is newly defined in addition to the upward and downward movement stroke L, the first component height L1, the second component height L2 and height dimension H1 of the low-height component P1 described in FIG. 3B. Here, a component in which the height dimension H2 is larger than the first component height L1 and is smaller than the second component height L2 is defined as the high-height component P2. That is, in the embodiment, a component which can avoid interference with the low-height component P1 already mounted on the board 6 by upward and downward movement operation of the component holder but cannot avoid interference with the high-height component P2 already mounted on the board 6 by upward and downward movement operation of the component holder is defined as the high-height component P2.

Since the high-height component P2 with the height dimension H2 defined in this manner does not interfere with the low-height component P1 present as the already mounted component but the height dimension H2 is higher than the first component height L1, interference between the high-height components P2 in the height direction occurs depending on the mounting movement paths of the mounting heads 11A, 11B holding the high-height components P2 when the high-height component P2 is included in the already mounted components. Because of this, component mounting work in the component mounting apparatus M5 using the high-height component P2 as the mounting target is constructed so as to avoid occurrence of interference by properly setting the mounting movement paths of the mounting heads 11A, 11B holding the high-height components P2 as described below.

Figure 5:
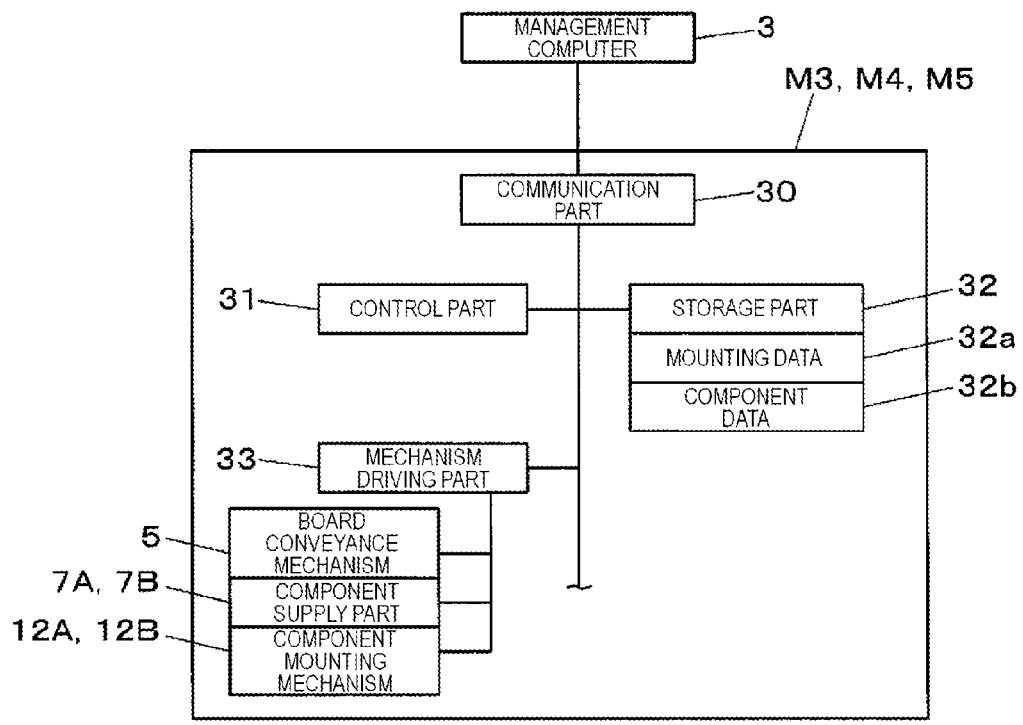
FIG. 5 is a block diagram showing a configuration of a control system of the component mounting apparatus in the component mounting system according to one embodiment of the present invention.

Next, a configuration of a control system is described with reference to FIG. 5. In FIG. 5, a control system of the component mounting apparatuses M3 to M5 includes a communication part 30, a control part 31, a storage part 32 and a mechanism driving part 33. The communication part 30 transfers a signal between the management computer 3 and the apparatuses. The control part 31 is a processor, and controls each of the following parts based on various processing programs or data stored in the storage part 32.

The data stored in the storage part 32 includes mounting data 32a, component data 32b, etc. The mounting data 32a is data indicating position coordinates and mounting order of a mounting point in the board 6, and a component targeted for mounting. The component data 32b is data about a size etc. of a component targeted for mounting.

The mechanism driving part 33 is controlled by the control part 31, and drives the board conveyance mechanism 5, the component supply part 7A, the component supply part 7B, the component mounting mechanism 12A and the component mounting mechanism 12B. Accordingly, various work processing such as component mounting work in the component mounting apparatuses M3 to M5 is executed.

Then, the control part 31 controls mounting operation by the component mounting mechanisms 12A, 12B so as to avoid interference between the high-height components P2 in mounting operation of the high-height components P2 based on the mounting data 32a and the component data 32b. In addition, in normal mounting operation in which the avoidance of interference is not considered, a mounting path is set in an oblique direction so that the amount of movement becomes the shortest distance in X and Y directions, but at the time of mounting operation in which the avoidance of interference is considered, the mounting path is set so as to be Y-direction reciprocating movement (see FIGS. 6A, 6B, 7A and 7B).

Next, a component mounting method of the embodiment is described. First, the board 6 targeted for mounting is carried in the component mounting system 1, and the board 6 is sequentially conveyed along each apparatus in a board conveyance direction, and component mounting operation is executed on the board 6. In this component mounting operation, a low-height component P1 is first mounted by the component mounting apparatuses M3, M4 which are the mounting apparatuses for low-height component (a low-height component mounting step). Next, the board 6 in which the low-height component P1 is mounted is further conveyed to the downstream side, and a high-height component P2 is mounted by the component mounting apparatus M5 which is the mounting apparatus for high-height component (a high-height component mounting step).

In this high-height component mounting step, the plural high-height components P2 are sequentially mounted, and interference-avoid mounting operation is executed in order to avoid interference between the high-height component P2 held by the component holder 11a and the high-height component P2 mounted on the board 6, occurring in this case. The control part 31 refers to the mounting data 32a and the component data 32b stored in the storage part 32 to thereby execute this interference-avoid mounting operation. Operation of advance of the component mounting mechanism 12A and the component mounting mechanism 12B to the board 6 is controlled so as to avoid interference between the high-height components P2 in mounting operation of the high-height component P2.

Figure 6A:
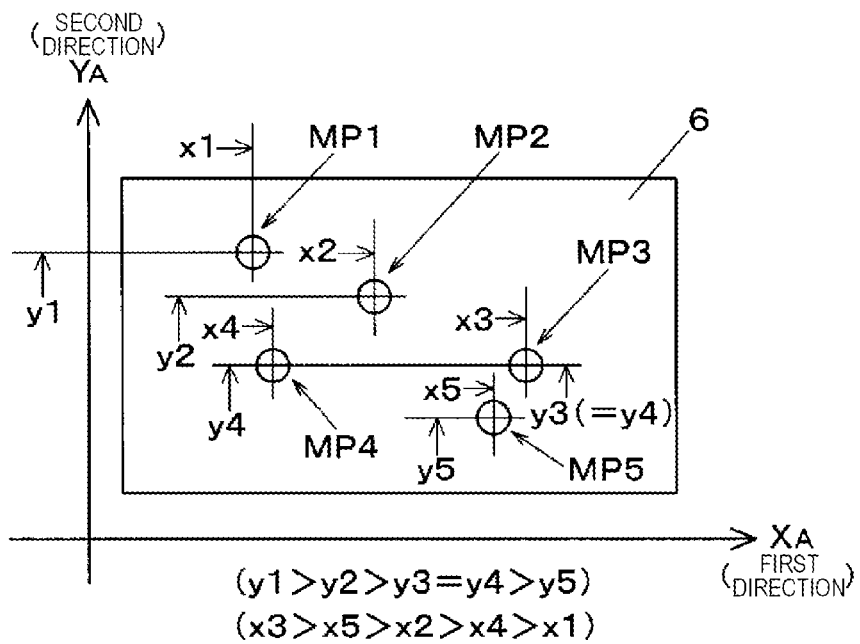
FIGS. 6A and 6B are explanatory diagrams of interference avoidance processing of the high-height component in a component mounting method according to one embodiment of the present invention.
Figure 6B:
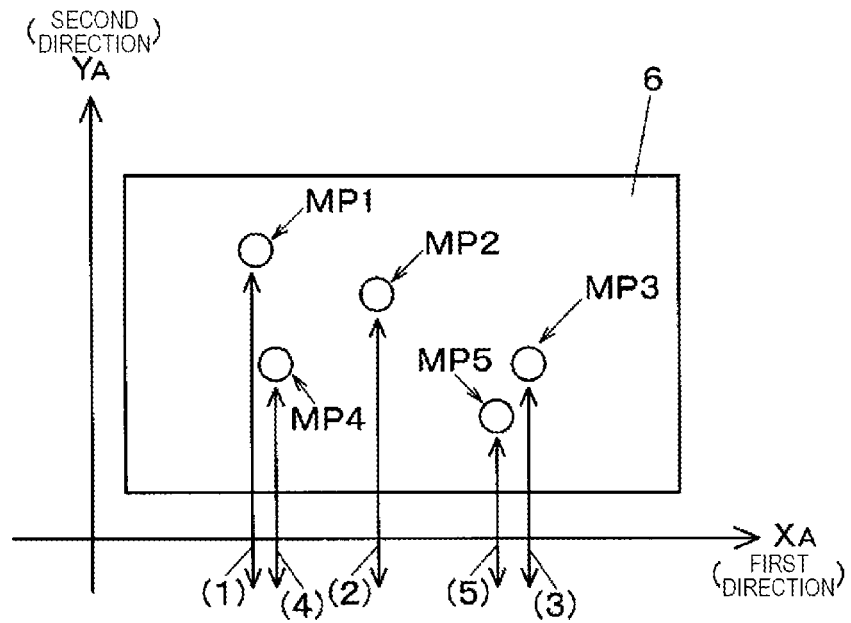

Here, the mounting operation of the high-height component P2 is described with reference to FIGS. 6A, 6B, 7A and 7B. FIGS. 6A and 6B show the mounting operation in the case of mounting the high-height components P2 at five mounting points of a mounting point MP1 to a mounting point MP5 set in the board 6 by only the mounting head 11A. As shown in FIG. 6A, mounting position coordinates of the mounting point MP1 to the mounting point MP5 are (x1, y1) to (x5, y5), respectively, with respect to an origin point defined at a cross point of the XA-YA orthogonal coordinate system in FIG. 6A. These coordinate values have a relation of y1>y2>y3=y4>y5 in a y coordinate of a second direction and x3>x5>x2>x4>x1 in an x coordinate of a first direction.

When the high-height components P2 are mounted using such mounting point arrangement as a target, the high-height components P2 are sequentially mounted on mounting order as shown in FIG. 6B. That is, using the mounting point MP1 with the largest mounting coordinate of the Y direction (second direction) relative to a reference line extending in the X direction (first direction) among these mounting points as the target, reciprocating mounting operation in which the mounting head 11A holding the high-height component P2 is advanced over the board 6 in the Y direction (arrow (1)) and the held high-height component P2 is mounted at the mounting point MP1 and thereafter the mounting head 11A is retracted from the board 6 in the Y direction is executed.

Then, using the mounting point MP2 with the second largest mounting coordinate of the Y direction as the target, similar reciprocating mounting operation is executed (arrow (2)) and subsequently, using the mounting points MP3 to MP5 as the targets sequentially in order in which the mounting coordinate of the Y direction is larger similarly, reciprocating mounting operations are executed (arrow (3) to arrow (5)). In the example shown herein, the mounting points MP3 and MP4 have a relation of y3=y4 and have the equal mounting coordinates of the Y direction. In such a case, the high-height component P2 is first mounted at the mounting point MP3 with the larger mounting coordinate of the X direction, and then mounted at the mounting point MP4.

That is, the component mounting example shown in FIGS. 6A and 6B is constructed so that in the high-height component mounting step using the high-height component P2 as the target, the reciprocating mounting operations in which the mounting head 11A which is the component holder is moved in the mounting order relative to the reference line extending in the first direction such that the mounting head 11A is advanced over the board 6 in the second direction orthogonal to the first direction by the component mounting apparatus M5 which is the mounting apparatus for high-height component and then the held high-height component P2 is mounted and thereafter the mounting head 11A is retracted from the board 6 in the second direction are repeated in mounting order. And, this mounting order is set in order in which the mounting coordinate of the high-height component P2 in the second direction is larger.

Figure 7A:
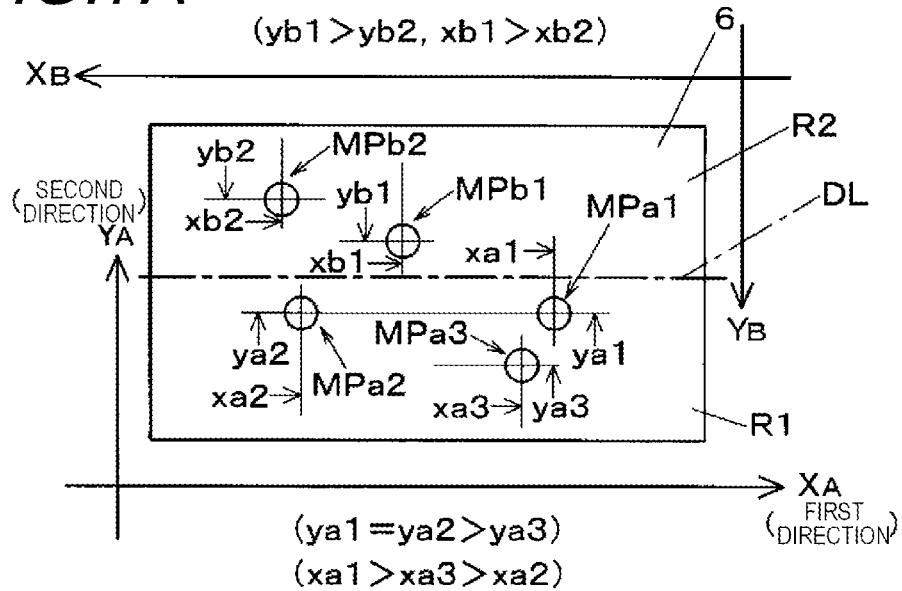
FIGS. 7A and 7B are explanatory diagrams of interference avoidance processing of the high-height component in the component mounting method according to one embodiment of the present invention.
Figure 7B:
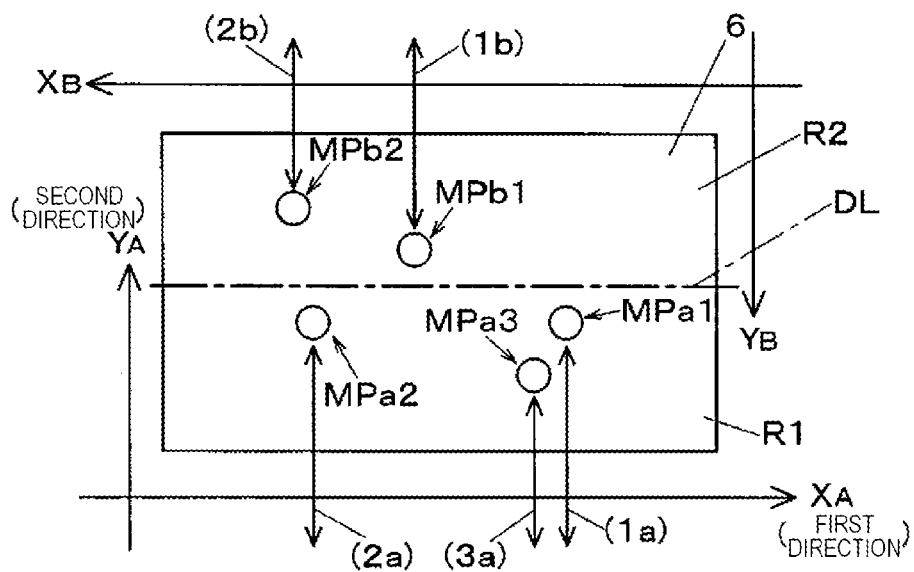

FIGS. 7A and 7B show mounting operation in the case of mounting the high-height components P2 from both sides by two mounting heads of the first mounting head 11A and the second mounting head 11B by targeting the common board 6. In this case, the board 6 is divided into a first region R1 and a second region R2 by a region-divide line DL set along the X direction as shown in FIG. 7A. The first region R1 and the second region R2 are regions in which component mounting is performed by the mounting heads 11A, 11B, respectively. Component mounting work using the first region R1 and the second region R2 as targets can individually be done by respectively driving the mounting heads 11A, 11B according to an XA-YA orthogonal coordinate system specific to the component mounting mechanism 12A and an XB-YB orthogonal coordinate system specific to the component mounting mechanism 12B.

Three mounting points of a mounting point MPa1 to a mounting point MPa3 are set in the first region R1, and two mounting points of a mounting point MPb1 and a mounting point MPb2 are set in the second region R2, respectively. Mounting position coordinates of the mounting point MPa1 to the mounting point MPa3 are (xa1, ya1) to (xa3, ya3), respectively, with respect to an origin point defined at a cross point of the XA-YA orthogonal coordinate system in FIG. 7A. These coordinate values have a relation of ya1=ya2>ya3 in the y coordinate of the second direction and xa1>xa3>xa2 in the x coordinate of the first direction. Also, mounting position coordinates of the mounting point MPb1 and the mounting point MPb2 are (xb1, yb1) and (xb2, yb2), respectively, with respect to an origin point defined at a cross point of the XB-YB orthogonal coordinate system in FIG. 7A. These coordinate values have a relation of yb1>yb2 in the y coordinate of the second direction and xb1>xb2 in the x coordinate of the first direction.

When the high-height components P2 are mounted using such mounting point arrangement as a target, mounting work is done in parallel by the mounting heads 11A, 11B using both of the first region R1 and the second region R2 as the targets as shown in FIG. 7B. Also in this case, reciprocating mounting operation is executed in order in which the mounting coordinate of the Y direction (second direction) is larger like the example shown in FIG. 6B. First, in the first region R1, the mounting points MPa1 and MPa2 have a relation of ya1=ya2 and have the equal mounting coordinates of the Y direction. In such a case, the high-height component P2 is first mounted at the mounting point MPa1 with the larger mounting coordinate of the X direction, and then mounted at the mounting point MPa2.

That is, first, using the mounting point MPa1 as the target, reciprocating mounting operation in which the component mounting mechanism 12A holding the high-height component P2 is advanced over the board 6 in the Y direction (arrow (1a)) and the held high-height component P2 is mounted at the mounting point MPa1 and thereafter the mounting head 11A is retracted from the board 6 in the Y direction is executed. Next, using the mounting point MPa2 as the target, similar reciprocating mounting operation is executed (arrow (2a)) and subsequently, using the mounting point MPa3 as the target in order in which the mounting coordinate of the Y direction is larger similarly, reciprocating mounting operation is executed (arrow (3a)).

In the second region R2, first, using the mounting point MPb1 with the largest mounting coordinate of the Y direction (second direction) as the target, reciprocating mounting operation in which the mounting head 11B holding the high-height component P2 is advanced over the board 6 in the Y direction (arrow (1b)) and the held high-height component P2 is mounted at the mounting point MPb1 and thereafter the mounting head 11B is retracted from the board 6 in the Y direction is executed. Next, using the mounting point MPb2 as the target, similar reciprocating mounting operation is executed (arrow (2b)).

That is, the component mounting example shown in FIG. 7B is constructed so that in the high-height component mounting step using the high-height component P2 as the target, the reciprocating mounting operations are executed with respect to the common board 6 from both sides of the board 6 in the Y direction (second direction) by the mounting head 11A (first mounting head) and the mounting head 11B (second mounting head) by the component mounting apparatus M5 which is the mounting apparatus for high-height component. Then, in this reciprocating mounting operation, the board 6 is divided into the first region R1 and the second region R2 by the region-divide line DL set along the X direction (first direction), and the mounting head 11A and the mounting head 11B respectively repeat the reciprocating mounting operations described above in mounting order using the first region R1 and the second region R2 as the targets. This mounting order is set in order in which the mounting coordinate of the high-height component P2 in the second direction is larger like the example shown in FIG. 6B.

As described above, the component mounting method and the component mounting system shown in the embodiment are constructed so that components are classified into the low-height component P1 capable of avoiding interference with the component already mounted on the board 6 by upward and downward movement operation of the suction nozzle 11a (component holder) attached to the mounting head and the high-height component P2 which does not interfere with the already mounted low-height component but may mutually interfere with the high-height component and in the high-height component mounting step of mounting the high-height component P2, reciprocating mounting operations in which the mounting head is moved in a mounting order relative to the reference line extending in the first direction such that the mounting head is advanced over the board 6 in the second direction orthogonal to the first direction and then the held component is mounted and thereafter the mounting head is retracted from the board 6 in the second direction are repeated and this mounting order is set in order in which the mounting coordinate of the high-height component P2 is larger in the second direction relative to the reference line.

Accordingly, individual processing (for example, an upward and downward movement stroke of the component holder is changed based on the highest component height of the already mounted components, or a horizontal movement path of the component holder is set so as to avoid a position in which the highest component is mounted) is not required every target board, and interference of the high-height component in component mounting operation can be prevented by a simple and versatile method.

In the above embodiment, it is assumed that the X direction (first direction) is the board conveyance direction in which the board 6 is conveyed from the upstream side, or parallel to the board conveyance direction. However, the board conveyance direction is not limited to that, and the X direction (first direction) is not necessarily the board conveyance direction. The board 6 may be conveyed in the Y direction (second direction) orthogonal to the X direction (first direction). Alternatively, the board 6 may be conveyed in any direction. That is, the board conveyance direction is not always essential in the present invention.

A component mounting method and a component mounting system of the present invention have an effect capable of preventing interference of a high-height component in component mounting operation by a simple and versatile method, and are useful in the component mounting field in which plural kinds of electronic components including a high-height component such as a connector component are mounted on a board.

What is claimed is:

1. A component mounting method for making a mounting head to which a component holder is attached perform component mounting operation including upward and downward movement operation with respect to a board conveyed in a board conveyance direction and mounting each component held by the component holder on the board, the component mounting method comprising:
  a low-height component mounting step of mounting a low-height component on the board; and
  a high-height component mounting step of mounting a high-height component on the board on which the low-height component is mounted, wherein
  the low-height component is a component capable of avoiding interference with a low-height component already mounted on the board by upward and downward movement operation of the component holder,
  the high-height component is a component which can avoid interference with the low-height component already mounted on the board by upward and downward movement operation of the component holder but cannot avoid interference with a high-height component already mounted on the board by upward and downward movement operation of the component holder, and
  the high-height component mounting step includes repeating reciprocating mounting operations in which the component holder is moved in a mounting order relative to a reference line extending in a first direction which is the board conveyance direction such that the component holder is advanced over the board in a second direction orthogonal to the first direction and then a high-height component held by the component holder is mounted and thereafter the component holder is retracted from the board in the second direction, wherein the mounting order is set in order in which a mounting coordinate of the high-height component is larger in the second direction relative to the reference line.

2. The component mounting method according to claim 1, wherein the high-height component mounting step includes performing the reciprocating mounting operations with respect to a common board from both sides of the board in the second direction by a first mounting head and a second mounting head, and
  the board is divided into a first region and a second region by a region-divide line set along the first direction, and the first mounting head and the second mounting head target the first region and the second region, respectively.

3. A component mounting system for making a mounting head to which a component holder is attached perform component mounting operation including upward and downward movement operation with respect to a board conveyed in a board conveyance direction and mounting each component held by the component holder on the board, the component mounting system comprising:
  a mounting apparatus for low-height component which mounts a low-height component on the board; and
  a mounting apparatus for high-height component which mounts a high-height component on the board on which the low-height component is mounted, wherein
  the low-height component is a component capable of avoiding interference with a low-height component already mounted on the board by upward and downward movement operation of the component holder,
  the high-height component is a component which can avoid interference with the low-height component already mounted on the board by upward and downward movement operation of the component holder but cannot avoid interference with a high-height component already mounted on the board by upward and downward movement operation of the component holder, and
  the mounting apparatus for high-height component repeats reciprocating mounting operations in which the component holder is moved in a mounting order relative to a reference line extending in a first direction which is the board conveyance direction such that the component holder is advanced over the board in a second direction orthogonal to the first direction and then a held high-height component is mounted and thereafter the component holder is retracted from the board in the second direction, wherein the mounting order is set in order in which a mounting coordinate of the high-height component is larger in the second direction relative to the reference line.

4. The component mounting system according to claim 3, wherein the mounting apparatus for high-height component comprises includes a first mounting head and a second mounting head for performing the reciprocating mounting operations with respect to a common board from both sides of the board in the second direction and in the case of the reciprocating mounting operations, and the board is divided into a first region and a second region by a region-divide line set along the first direction, and the first mounting head and the second mounting head target the first region and the second region, respectively.

\* \* \* \* \*